United States Patent

Iwasaki et al.

Patent Number: 5,852,293
Date of Patent: Dec. 22, 1998

[54] RASTER DATA DRAWING APPARATUS FOR CORRECTING IMAGE STARTING POSITION

[75] Inventors: Etsuo Iwasaki; Takashi Okuyama, both of Tokyo, Japan

[73] Assignee: Asahi Kogaku Kogyo Kabushiki Kaisha, Tokyo, Japan

[21] Appl. No.: 912,845

[22] Filed: Aug. 19, 1997

[30] Foreign Application Priority Data

Aug. 20, 1996 [JP] Japan ................................. 8-237156

[51] Int. Cl.⁶ ................................................. H01J 3/14
[52] U.S. Cl. ............................................ 250/235; 347/250
[58] Field of Search ............................. 250/234, 235, 250/236; 358/481, 486; 359/216; 347/235, 234, 250

[56] References Cited

U.S. PATENT DOCUMENTS

| 4,677,292 | 6/1987 | Shimada | 250/235 |
| 5,015,846 | 5/1991 | Okuyama | 250/235 |
| 5,027,137 | 6/1991 | Andoh. | |
| 5,247,373 | 9/1993 | Iwama. | |

*Primary Examiner*—Que Le
*Attorney, Agent, or Firm*—Greenblum & Bernstein, P.L.C.

[57] ABSTRACT

Disclosed is a raster data drawing apparatus, in which a reference clock pulse signal having a predetermined period is first generated, and then a plurality of delayed clock signals are generated. Phases of the plurality of delayed clock signals are shifted by a period of time which is shorter than the predetermined period. An image is formed in a main scanning direction synchronously with one of the plurality of delayed clock signals so that the starting point of the image in the main scanning direction is adjusted.

7 Claims, 5 Drawing Sheets

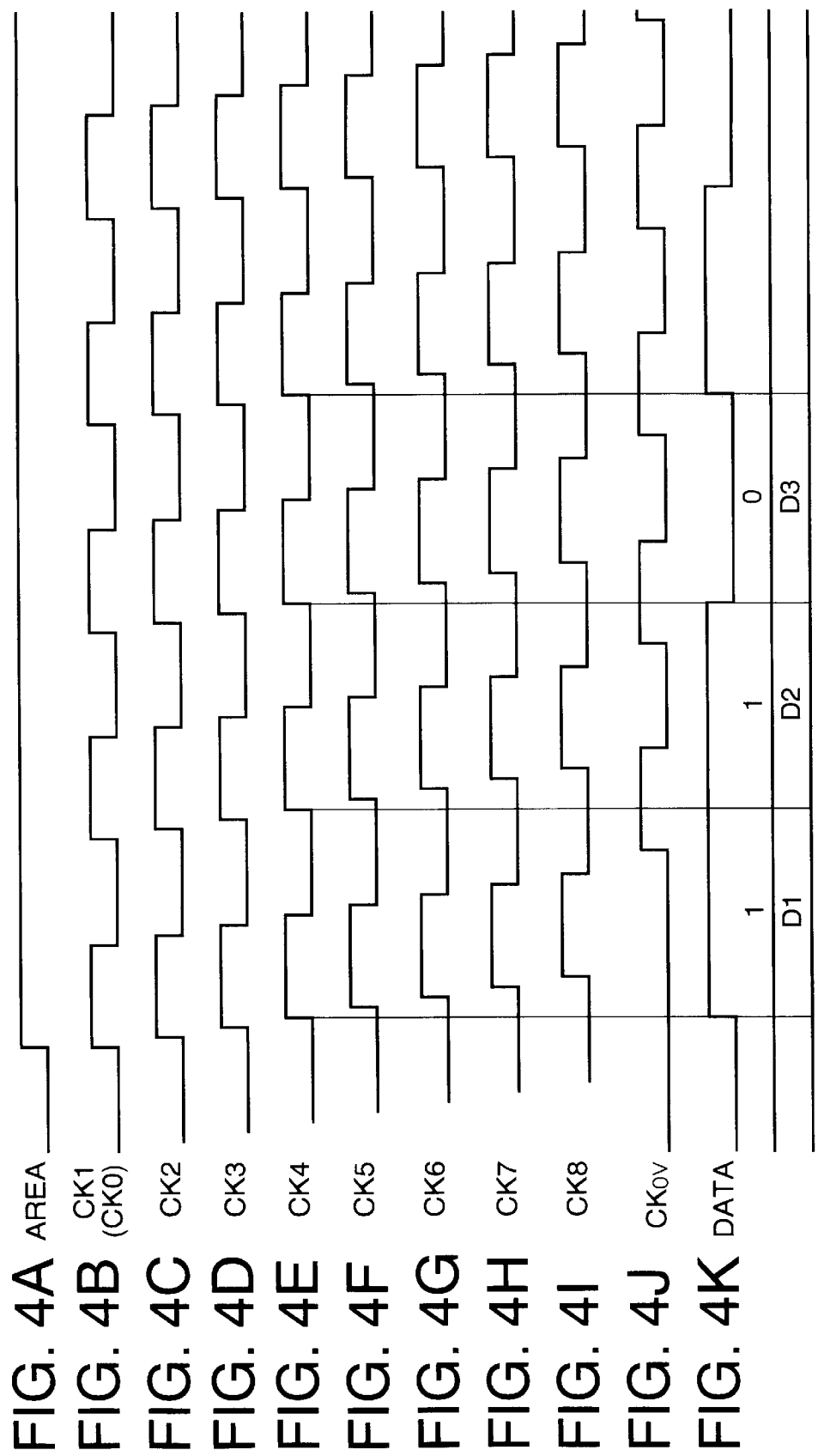

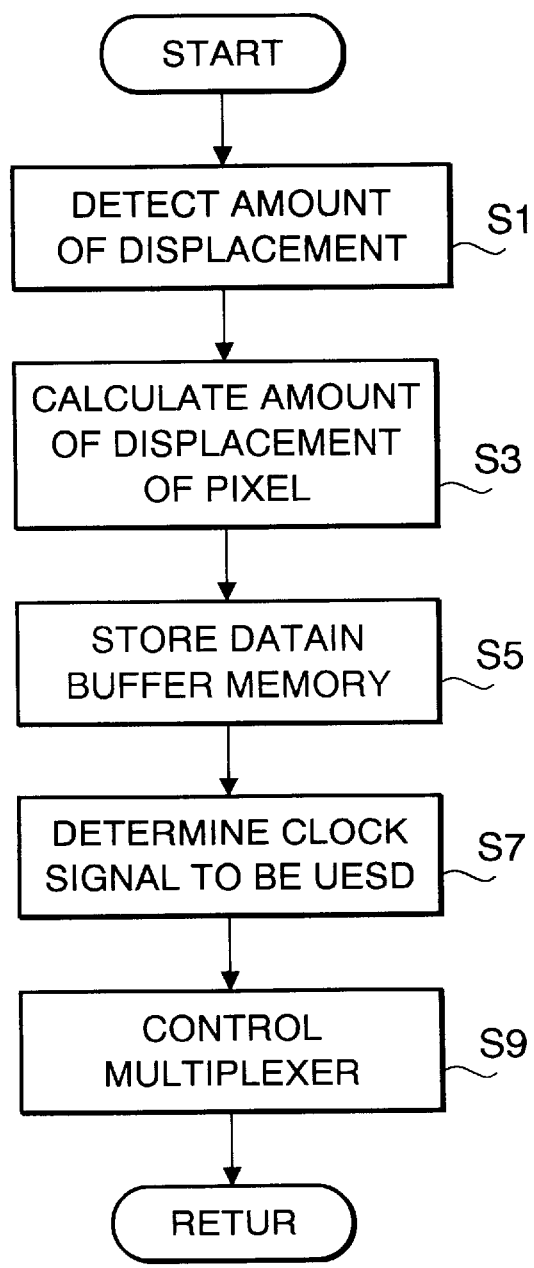

RASTER DATA DRAWING APPARATUS FOR CORRECTING IMAGE STARTING POSITION

BACKGROUND OF THE INVENTION

The present invention relates to a raster data drawing apparatus used to draw a pattern or the like of a printed circuit board on a substrate.

In a known method of forming a circuit pattern on a substrate, a photo-polymer or the like is uniformly spread on a substrate on which a thin film composed of a conductive material, such as, for example, copper or the like, is deposited. A printing mask (photomask film) on which the circuit pattern is formed is placed over the photo-polymer, and irradiated by ultraviolet rays, or the like, so that the circuit pattern on the printing mask is exposed and printed onto the substrate.

An alternative method of directly exposing an image corresponding to a circuit pattern onto a substrate without using the exposing and printing mask involves scanning a laser beam, modulated in accordance with raster data corresponding to the circuit pattern, onto the substrate through a deflecting system, such as a polygon mirror or the like. In particular, the circuit pattern is drawn on the substrate using the raster data by scanning the laser beam in a predetermined direction (a main scanning direction) on the substrate placed on a work table. The work table is moved in a direction perpendicular to the main scanning direction (a sub-scanning direction) in synchronism with the main scanning of the laser beam to thereby form a two-dimensional image on the substrate which corresponds to the circuit pattern.

Due to the high density and high definition of the circuit patterns to be formed, pinpoint accuracy, in a range of 1 $\mu$m, is required in the positioning of a circuit pattern formed on a printed circuit board. To achieve this accuracy in the photomask method, it suffices only for the photomask to be accurately aligned with the substrate. However, in the raster data drawing method, the position of the substrate on the work table, the movement of the work table in the sub-scanning direction, and the drawing start position of the drawing apparatus in the main scanning direction must all be precisely controlled.

In the raster data drawing method, the substrate is positioned on the work table by aligning the substrate with a positioning marker or the like on the work table. However, since sufficient accuracy cannot be obtained in this way, the position of the substrate on the work table is corrected by accurately reading the position of the substrate using a CCD camera or the like. Thereafter, the position of the substrate in the sub-scanning direction is corrected by controlling the movement of the work table and the position of the substrate in the main scanning direction is corrected by changing a timing at which the output of the raster data starts.

Conventionally, the movement of the work table in the sub-scanning direction can be controlled with an accuracy of 1 $\mu$m. Therefore, the positioning of the substrate in the sub-scanning direction can be accurately set with an accuracy of 1 $\mu$m.

However, it is difficult for the conventional apparatus to obtain sufficient accuracy in the main scanning direction. Conventionally, the raster data (image drawing data) is stored in a memory in units of pixels. Further, an image is drawn by first setting a reference position a predetermined distance outside of an image drawing region and then starting a modulation of a scanning beam (i.e. turning the scanning beam ON and OFF) in correspondence to image drawing data a predetermined time after the scanning beam passes the reference point. When the substrate is accurately placed at a predetermined position on the work table in the main scanning direction, it is possible to start the drawing of the image at the above predetermined timing (i.e., the predetermined time after the scanning beam passes the reference position). However, if the substrate is displaced from the predetermined position in the main scanning direction, the timing at which the drawing starts must be adjusted according to that displacement.

Conventionally, the timing at which the image is drawn in the main scanning direction is changed by shifting the image drawing data stored in a memory in units of pixels. Specifically, the image drawing data stored in a data memory is moved to a buffer memory, and is stored in the buffer memory shifted by a necessary amount in units of pixels. Therefore, the position where the image is drawn in the main scanning direction can be adjusted in units of pixels (each pixel corresponding to an image drawing dot on an image drawing plane).

However, since each image drawing dot has a pitch of about 5–10 $\mu$m on the image drawing plane, the position where the drawing of the image starts in the main scanning direction can be adjusted only as accurately as a dot pitch. However, as described above, it is preferable to have an accuracy of approximately 1 $\mu$m in the formation of the circuit pattern on the printed circuit board. Thus, a maximum error of approximately ½ pixel must be intrinsically adjusted in the conventional method.

In theory, an increase in the number of pixels (i.e., the resolution) may reduce the error. However, to achieve an accuracy of units of 1 $\mu$m by increasing the number of pixels, it is necessary to greatly increase the capacity of the memory which extremely increases costs.

SUMMARY OF THE INVENTION

It is therefore an object of the present invention to provide an improved, inexpensive raster data drawing apparatus in which a position where an image starts to be drawn in a main scanning direction may be adjusted accurately.

According to one aspect of the invention, there is provided a raster data drawing apparatus, comprising means for providing raster data; a light source that emits a light beam; a scanning system that scans the light beam in a main scanning direction on an image drawing plane; a reference clock generator that generates a reference clock pulse signal having a predetermined period; a delayed clock generator that outputs a delayed clock signal representing the reference clock signal delayed by a period of time shorter than the predetermined period; and an image drawing controller, which modulates the light beam based on the raster data in synchronism with the delayed clock signal for each scan of the light beam in the main scanning direction.

With this construction, a fine adjustment of a position, in the main scanning direction, at which the image starts can be done, because the delayed amount of the delayed clock signal is shorter than the period of the reference clock signal.

Optionally, the reference clock generator may include a linear scale provided with a plurality of equally spaced slits along the main scanning direction, and the linear scale receives a portion of the scanned light beam. The reference clock generator may also includes a fluorescent optical fiber arranged on an opposite side of the linear scale receives the light beam. A light receiving element is provided at an end of the fluorescent optical fiber, wherein the light receiving element outputs a pulse signal each time the scanned light beam passes over one of the slits and the reference clock generator outputs the reference clock pulse signal based on the pulse signal.

In accordance with the above structure, the reference signal is generated synchronously with the scanning beam exactly, and therefore, the image drawing operation is accurately controlled.

In this case, the raster data drawing apparatus may further include an optical system that divides the scanned light beam into a drawing beam and a reference beam, so that the portion of the scanned light beam received by the linear scale is the reference beam.

Further optionally, the delayed clock generator may include a delay circuit that outputs a plurality of selectable delayed clock signals. A first selectable delayed clock signal being formed by delaying the reference clock pulse signal by a second predetermined period and forming subsequent selectable delayed clock signals by delaying a previous selectable delayed clock signal by the second predetermined period. The second predetermined period is shorter than the predetermined period. A selector selects one of the plurality of selectable delayed clock signals.

Since the appropriate one of the plurality of delayed clock signals is selected, the image starting position can be easily adjusted.

Still optionally, the selector may include a position detection device that detects a displacement of the image drawing plane from a reference position; and a controller that selects one of the plurality of selectable delayed clock signals based on the detection of the position detection device.

Furthermore, the raster data drawing apparatus may include means for shifting, in units of pixels, the raster data provided by the providing means at least in the main scanning direction, when an image is drawn, and wherein the raster data drawing apparatus corrects for a displacement of the image drawing plane from the reference position in the main scanning direction detected by the position detection device by the shift of the data in units of pixels executed by said shifting means and the selection of one of the plurality of selectable delayed clock signals. Thus, a rough adjustment and a fine adjustment can be achieved.

According to another aspect of the invention, there is provided a method for correcting for a displacement, in a main scanning direction, of an image drawing plane in relation to a reference position, in a scanning image forming system in which an image is formed on an image drawing plane, the method comprising: detecting a displacement, in a main scanning direction, of the image drawing plane from the reference position; generating a reference clock signal having a predetermined period; generating a plurality of delayed clock signals delayed from the reference clock signal by a plurality of periods, each less than the predetermined period; selecting one of said plurality of delayed clock signals based on the displacement; and forming the image based on the selected one of delayed clock signals.

With this method, the fine adjustment of the position, in the main scanning direction, at which the image is drawn can be performed.

BRIEF DESCRIPTION OF THE DRAWINGS

The invention will be better understood by referring to the description which follows with references to the drawings. The drawings illustrate, by way of non-limiting examples, embodiments of the invention therein and are an integral part thereof.

FIGS. 4(A) through 4(K) are timing charts showing a relationship between clock signals and a data signal; and FIG. 5 is a flowchart for selecting a clock signal from among a plurality of clock signals.

DETAILED DESCRIPTION OF THE PREFERRED EMBODIMENTS

Figure 1:
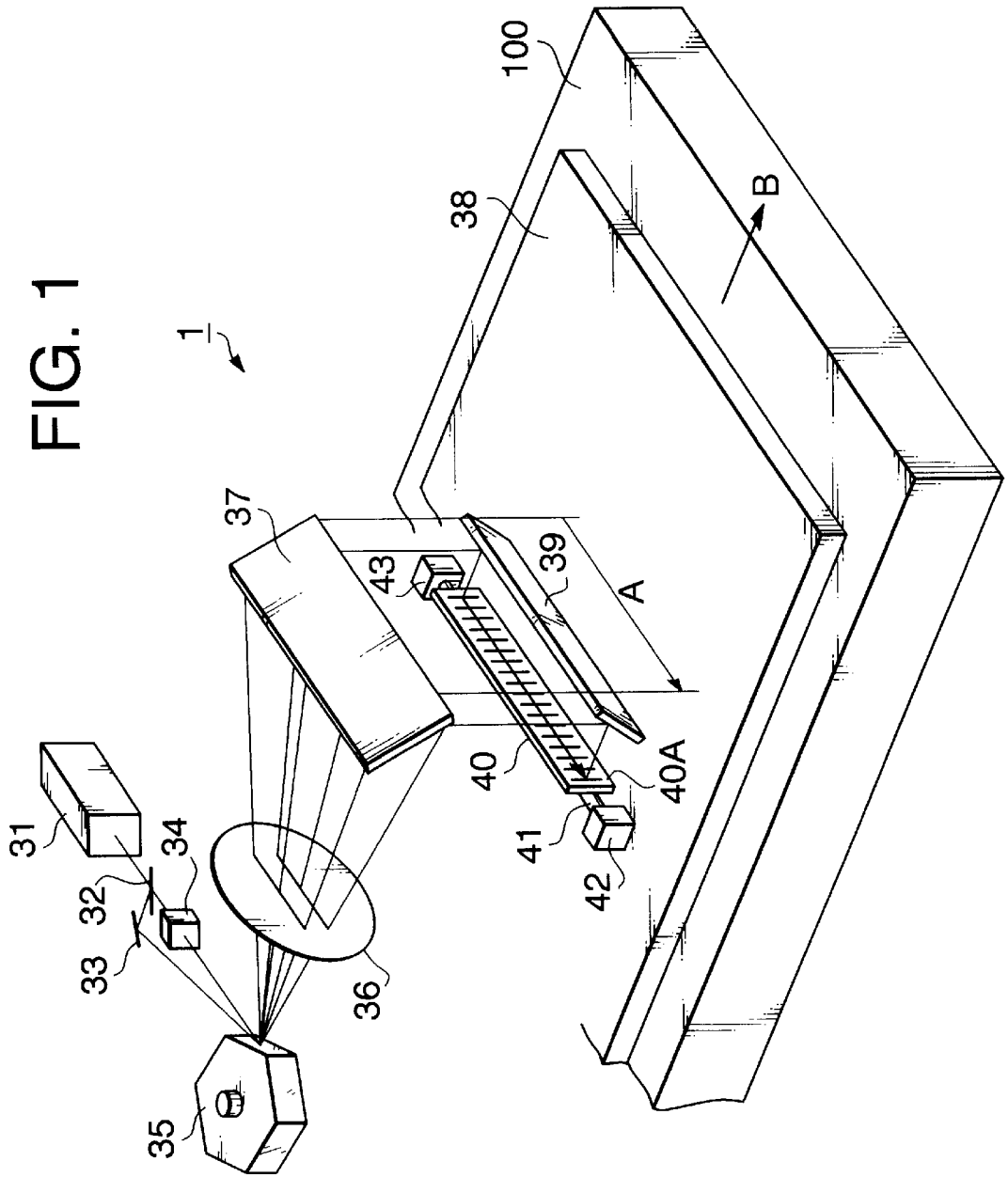
FIG. 1 is a schematic perspective view of a raster data drawing apparatus according to an embodiment of the invention.

FIG. 1 is a schematic perspective view of a raster data drawing apparatus 1 according to an embodiment of the invention. As shown in FIG. 1, a laser light source 31 transmits a laser beam to a half mirror 32. The half mirror 32 divides the laser beam into an image drawing beam, i.e., a portion of the laser beam that passes through the half mirror 32, and a reference beam, i.e., a portion of the laser beam that is reflected by the half mirror 32. The image drawing beam is modulated by an acousto-optic modulator (AOM) 34 based on raster data. The modulated image drawing beam is deflected by a deflector, such as a polygon mirror 35, passes through an fθ lens 36, is reflected by a mirror 37, and scans along a substrate 38 in the direction of an arrow A in FIG. 1 to form an image.

Simultaneously, after being reflected at the half mirror 32, the reference beam is reflected by a mirror 33 toward the polygon mirror 35. The reference beam is reflected by the polygon mirror 35, passes through the fθ lens 36, is further reflected by the mirror 37 to a mirror 39. The reference beam is reflected by the mirror 39 to scan along a light receiving surface 40A of a linear scale 40 (described in more detail below). A fluorescent optical fiber 41 is disposed beside the linear scale 40 on a side opposite to the mirror 39. Light receiving elements 42, 43 are disposed at the ends of the fluorescent optical fiber 41 to receive the light bean radiated from the ends of the fluorescent optical fiber 41.

Figure 2:
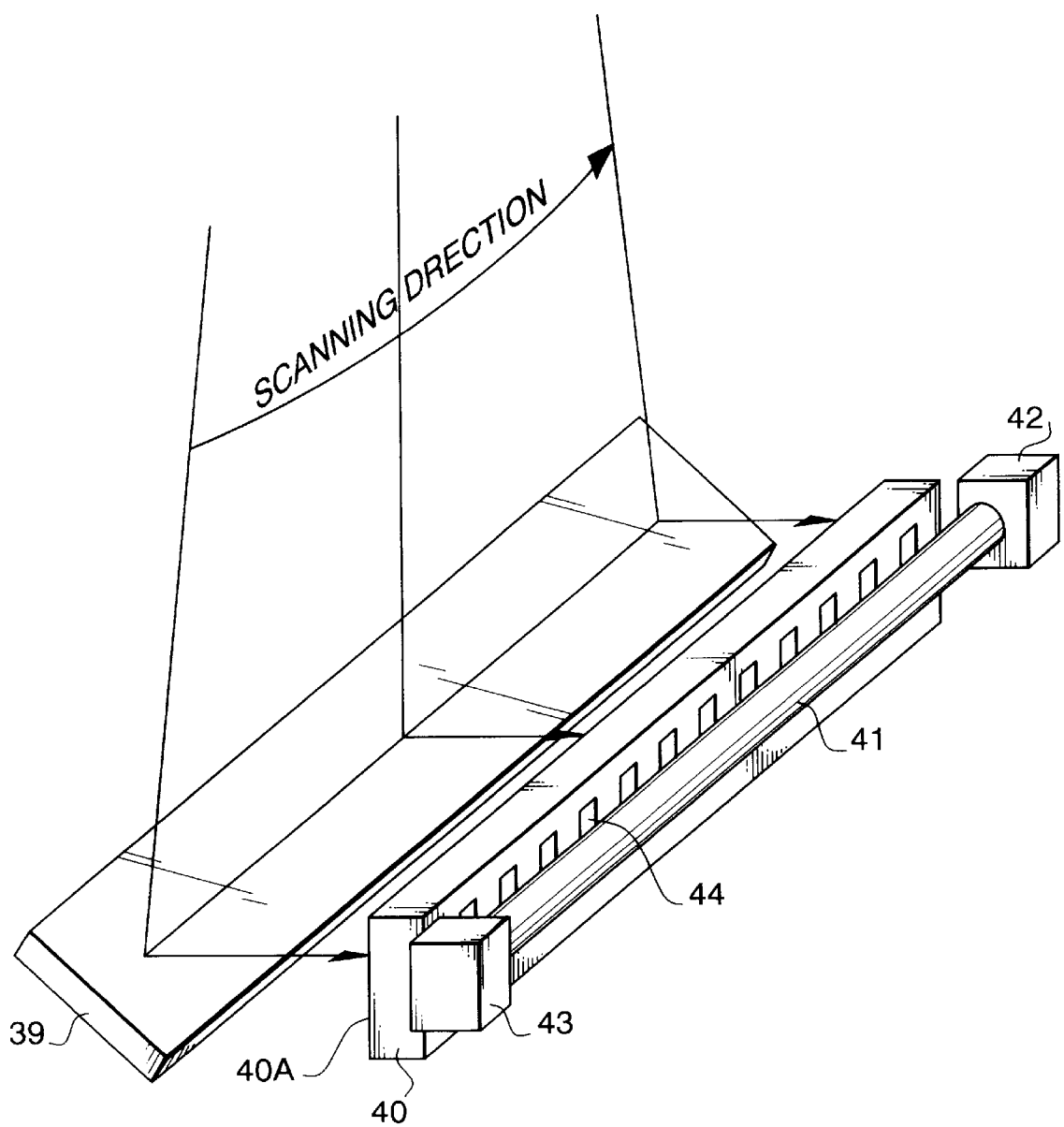
FIG. 2 is an enlarged perspective view illustrating a vicinity of a linear scale of the raster data drawing apparatus of FIG. 1.

The linear scale 40 is now described in more detail with reference to FIG. 2. FIG. 2 is a perspective view showing the vicinity of the linear scale 40 as viewed from a side opposite to the mirror 39. As described above, the reference beam is reflected by the mirror 39 and is incident on the scanning light receiving surface 40A of the linear scale 40. The linear scale 40 is provided with a plurality of slits 44 cyclically formed along the scanning direction of the reference beam. The plurality of slits 44 allow the reference beam to pass through the linear scale 40. The remainder of the linear scale 40 is formed of a non-translucent material, such that the reference beam is substantially prevented from passing therethrough, i.e., to shade or sufficiently attenuate the reference beam. Alternatively, the slits 44 could be formed as translucent portions in a non-translucent material.

The fluorescent optical fiber 41 includes a fluorescent material, such that, when the reference beam is incident on the fluorescent optical fiber 41 through the slits 44, the fluorescent optical fiber 41 emits fluorescent light. The fluorescent light radiates from both ends of the fluorescent optical fiber 41 and is received by the light receiving elements 42 and 43.

Since the slits 44 are cyclically formed, as the reference beam scans the light receiving surface 40A, the reference beam cyclically passes through the slits 44 and is incident on the fluorescent optical fiber 41. As a result, a pulsed ON and OFF signal having a predetermined frequency corresponding to the intervals of the slits 44 and the scanning speed of the reference beam is output by the light receiving elements 42 and 43.

Figure 3:
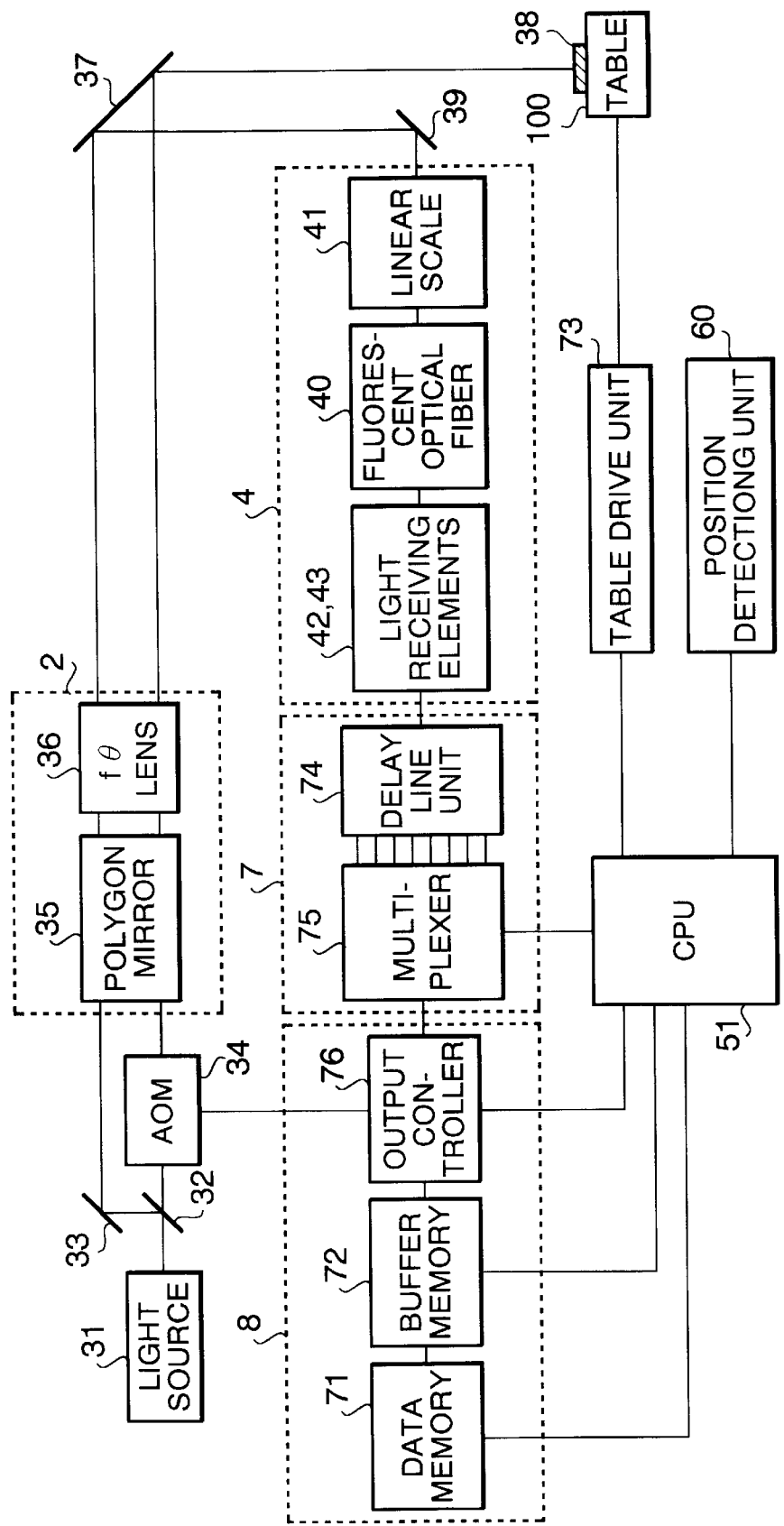
FIG. 3 is a schematic block diagram of the raster data drawing apparatus of FIG. 1.

FIG. 3 is a block diagram of the raster data drawing apparatus 1. As described above, the laser beam from the laser light source 31 is divided into the image drawing beam and the reference beam by the half mirror 32. The image drawing beam is modulated by the acousto-optic modulator (AOM) 34, based on image drawing data and is incident on a scanning optical system 2 composed of the polygon mirror 35 and the fθ lens 36. Simultaneously, the reference beam is reflected by the mirror 33 and is then incident on the scanning optical system 2 composed of the polygon mirror 35 and the fθ lens 36. Thus, even though the image drawing beam will be modulated to be ON and OFF according to the image drawing data, the reference beam will always be ON during operation of the raster data drawing apparatus 1.

After passing through the scanning optical system 2, the image drawing beam is reflected by the mirror 37 toward the substrate 38 (an image drawing plane) and, based on a rotation of the polygon mirror 35, scans the substrate 38.

At the same time that the image drawing beam scans the substrate 38, the reference beam scans the scanning light receiving surface 40A of the linear scale 40 and, as the reference beam scans, the reference beam periodically passes through the slits 44 and is incident on the fluorescent optical fiber 41. As described above, the light radiated from the ends of the fluorescent optical fiber 41 is received by the light receiving elements 42, 43 which output a pulse signal having a predetermined frequency corresponding to the received light (the pulse signal is described in more detail below).

When forming an image, the position of the substrate 38 is adjusted in the sub-scanning direction for each main scan of the laser beam. That is, an image is drawn in the main scanning direction at a predetermined frequency and the substrate 38 is moved in the sub-scanning direction at a predetermined speed to thereby draw a two-dimensional image (circuit pattern) on the substrate 38.

The raster data drawing apparatus 1 further includes a position adjustment controller 7, an image drawing controller 8, a table 100 on which the substrate 38 is positioned, a table drive unit 73 for moving the table 100 in the sub-scanning direction, a position detecting unit 60 for determining a position of the substrate 38 on the table 100, and a CPU 51 which controls the position controller 7, the image drawing controller 8, and the table drive unit 73 in accordance with data received from the position detecting unit 60.

More particularly, the position detecting unit 60 detects a difference between an actual position of the substrate 38 on the table 100 and a reference position. The position detecting unit 60 includes a CCD camera that forms an image of the substrate 38 on the table 100 and a calculation device that calculates how much the substrate 38 is displaced from the reference position. That is, the calculation device calculates a main amount representing a displacement in a main scanning direction and an auxiliary amount representing a displacement in a sub-scanning direction, respectively, based on an index (not shown) formed on the table 100 and an index (not shown) formed on the substrate 38. The position detecting unit 60 outputs the main amount and the auxiliary amount to the CPU 51.

Based on the auxiliary amount, the CPU 51 controls the table drive unit 73 such that the table 100 is moved in the sub-scanning direction so as to cancel the displacement of the substrate 38 with respect to the table 100 in the sub-scanning direction. In this way, the initial position (i.e., where the image starts to be drawn) in the sub-scanning direction can be set with an accuracy of 1 μm by the movement of the table 100. As a result, the initial position can be set with sufficient accuracy only by changing the position of the table 100. For example, if the substrate 38 is displaced with respect to the reference position in a positive direction in the sub-scanning direction, the initial position of the table 100 must be displaced in the B direction in FIG. 1 to cancel the displacement. That is, displacement in the sub-scanning direction can be corrected by moving the table 100.

The image drawing controller 8 includes a data memory 71, a buffer memory 72, and an output controller 76. The data memory 711 stores raster data for drawing the image (that is, raster data corresponding to the circuit pattern). The buffer memory 72 is used to roughly correct a positional displacement between the substrate 38 and the reference position on the table 100 in the main scanning direction. In the embodiment, similar to the conventional apparatus as described above, the data stored in the data memory 71 is stored in the buffer memory 72 shifted in the main scanning direction in units of pixels to roughly correct for the main amount (i.e., the difference in the main scanning direction between the actual position where the substrate 38 is placed on the table 100 and the reference position). The output controller 76 then controls the acousto-optic modulator (AOM) 34 using the data stored in the buffer memory 72 to turn the image drawing beam ON and OFF.

According to this conventional method of correction for displacement of the substrate 38 in the main scanning direction, an image drawing position may be displaced on the image drawing plane in the main scanning direction in units of pixels. That is, since the image drawing position is displaced on the substrate in units of 5–10 μm by the correction using a shift of the data, sufficient accuracy cannot be obtained.

However, to cope with this problem, the raster data drawing apparatus 1 according to the embodiment employs a further arrangement for changing a timing at which the image is drawn.

Thus, the raster data drawing apparatus 1 includes a scanning position detector 4 including the linear scale 40, the optical fiber 41 and the light receiving elements 42, 43, and the position adjustment controller 7 includes a delay clock unit 74 and a multiplexer 75.

Scanning position detector 4 outputs a control clock signal and an effective area signal, based on the pulse signal output by the light receiving elements 42 and 43, to the delay clock unit 74 of the position adjustment controller 7. The control clock signal is synchronized with a timing at which the main scanning beam passes through respective pixels. That is, for each control clock signal, the data of one pixel in the buffer memory 72 should be sent to the acousto-optic modulator (AOM) 34 to thereby modulate the laser beam (that is, draw the image in the main scanning direction). Further, the effective area signal is ON only when the scanning beam scans a predetermined scanning area (region where the image can be drawn).

FIGS. 4(A) through 4(K) are timing charts of the effective area signal AREA, a control clock signal CK0 and a first delayed clock signal CK1, delayed clock signals CK1–CKn, and an image drawing data DATA, respectively. (Note, since the clock signal CK1 is the same as the clock signal CK0, they are shown by the same line in FIG. 4(b)).

When the control clock signal (reference clock signal) CK0 is input to the delay clock unit 74, a plurality of clock signals CK1–CKn are output, each of which is sequentially delayed by a predetermined period of time (10 nanoseconds in the embodiment) with respect to a previous clock signal. In other words, when the control clock signal CK0 is input to the delay clock unit 74, the delay clock unit 74 outputs n clock signals, that is, a clock signal CK1 having a delay time of zero, a clock signal CK2 having a delay time of 10 nanoseconds, a clock signal CK3 having an additional delay time of 10 nanoseconds to the clock signal CK2, . . . a clock signal CK8 which is delayed by 70 nanoseconds to the clock signal CK1, . . . and a clock signal CKn which is delayed by (n−1)×10 nanoseconds with respect to the clock signal CK1 (n is an integer which is set in accordance with a required accuracy).

All of the plurality of clock signals CK1–CKn created as described above are transferred from the delay clock unit 74 to the multiplexer 75 and, as described below, the CPU 15 controls the multiplexer 75 to output a selected clock signal from among the plurality of clock signals CK1–CKn.

In the embodiment, the CPU 51 first corrects by an amount (rough correction) in units of pixels in such a manner that when the data in the data memory 71 is transferred to the buffer memory 72, the position of the data is shifted based on main amount (i.e., the positional error of the substrate 38 in the main scanning direction detected by the position detecting unit 60). The CPU 51 then further corrects (fine adjustment) for an amount of error which is smaller than the units of pixels by selecting a selected clock signal from the plurality of clock signals CK1–CKn input to the multiplexer 75 and using it as an image drawing control clock signal. As described above, the CPU 51 controls the multiplexer 75 to transfer only the selected clock signal to the image drawing controller 8 (output controller 76).

Note, the amount of error which can be corrected in units of pixels (that is, the amount of error which can be corrected when the data is transferred from the data memory 71 to the buffer memory 72) is in units of 5–10 $\mu$m and the amount of error which can be corrected by selecting among the clock signals CK1–CKn is in units of 0.3 $\mu$m when it is assumed that the clock signal has a cycle of 150 nanoseconds, the delay time between the respective clock signals is 10 nanoseconds, and a pixel has a diameter of 5 $\mu$m on the image drawing plane.

Next, the operation of the image drawing controller 8 will be described. As described above, the CPU 51 selects a clock signal (as an example, the clock signal CK4) for correcting the positional displacement between the substrate 38 and the table 100 from the clock signals CK1–CKn and transfers the selected clock signal (image drawing control clock signal) to the output controller 76 of the image drawing controller 8.

The image drawing controller 8 reads out the data in the buffer memory 72 in synchronism with the image drawing control clock signal (that is, the clock signal CK4). The thus read-out data is shown as the image drawing data DATA in FIG. 4.

When an ON pixel is contained in the image drawing data DATA, the output controller 76 keeps the image drawing beam in an ON state, without repeatedly tuning the image drawing beam ON and OFF for each pixel from the image drawing clock signal. Also, when the image drawing data DATA includes OFF pixels for a predetermined period of time, after the image drawing data DATA changes from the ON state to the OFF state, the image drawing beam is turned OFF. For example, when image drawing data D1 and D2 are ON (set to 1) as in FIG. 4, the output signal from the output controller 76 is kept in an ON state, as shown by DATA. Since data corresponding to the third pulse of CK4 is OFF (set to 0) as shown by D3, the output signal from the output controller 76 is set to the OFF state. Thus, when a line is drawn in the main scanning direction by the control of the output controller 76, the line, rather than being drawn as an aggregation of dots, is drawn by continuously exposing a portion which corresponds to the line in a state that the line is free from irregularity regardless of resolution. That is, the line is drawn as a continuous line in the main scanning direction in place of an aggregation of dots.

FIG. 5 is a flowchart illustrating the control executed by the CPU 51 in selecting an image drawing control clock signal from among the plurality of clock signals CK1–CKn.

When the substrate 38 is placed on the table 100, the difference between the position of the substrate 38 and the reference position is detected by the position detecting unit 60 (step S1). The CPU 51 determines the amount of shift of the data on the buffer memory 72 based on the displacement in the main scanning direction (step S3) and moves the data from the data memory 71 to the buffer memory 72 after displacing the data by the amount of shift (step S5). Further, the CPU 51 determines which of the plurality of clock signals CK1–CKn is selected based on the displacement between the substrate 38 and the reference position which has not been corrected for by the shift of the data as the data is moved to the buffer memory 72 (step S7) and sends a clock selection signal to the multiplexer 75 (step S9) indicating the selected clock signal (i.e., image drawing control clock signal).

For example, assuming that the positional displacement between the substrate 38 and the reference position in the main scanning direction is D $\mu$m (i.e., the main amount), a minimum unit which can be corrected using the buffer memory is d $\mu$m, and a unit which can be corrected using a selected clock signal from the delay clock unit 74 is $\alpha\mu$m, the positional displacement D is first represented by the formula:

$$D = N \cdot d + \Delta$$

where, a maximum integer N is an integer for which $\Delta<0$ is not established, i.e., the data is transferred from the data memory 71 to the buffer memory 72 such that the data is shifted by an amount corresponding to N, and a remaining displacement amount $\Delta$ is an amount of displacement which cannot be corrected using the shifted transfer to the buffer memory 72.

Accordingly, a selected clock signal x from among the clock signals CK1–CKn is selected based on the following formula:

$$x = INT [\Delta/\alpha] + 1$$

where, INT[ ] is a function for extracting the integer portion of a numerical value in the square brackets and an x-th clock signal CKx is selected as a clock signal which is used when an image is drawn (i.e, the image drawing control clock signal).

According to the present invention, a main scanning direction start position can be adjusted by a simple arrangement to give an accuracy which is higher than that achieved by the method of shifting data using a buffer memory.

Although the structure and operation of a raster data drawing apparatus is described herein with respect to the preferred embodiments, many modifications and changes can be made without departing from the spirit and scope of the invention.

The present disclosure relates to subject matter contained in Japanese Patent Application No. HEI 08-237156, filed on Aug. 20, 1996, which is expressly incorporated herein by reference in its entirety.

What is claimed is:

1. A raster data drawing apparatus, comprising:

means for providing raster data;

a light source that emits a light beam;

a scanning system that scans said light beam in a main scanning direction on an image drawing plane;

a reference clock generator that generates a reference clock pulse signal having a predetermined period;

a delayed clock generator that outputs a delayed clock signal representing said reference clock signal delayed by a period of time shorter than said predetermined period; and an image drawing controller, that modulates said light beam, based on said raster data in synchronism with said delayed clock signal, for each scan of said light beam in said main scanning direction.

2. The raster data drawing apparatus according to claim 1, said reference clock generator comprising:

a linear scale provided with a plurality of equally spaced slits along said main scanning direction, said linear scale receiving a portion of said scanned light beam;

a fluorescent optical fiber arranged on an opposite side of said linear scale with respect to said received light beam; and a light receiving element provided at an end of said fluorescent optical fiber, wherein said light receiving element outputs a pulse signal each time said scanned light beam passes over one of said slits and said reference clock generator outputs said reference clock pulse signal based on said pulse signal.

3. The raster data drawing apparatus according to claim 2, further comprising an optical system that divides said scanned light beam into a drawing beam and a reference beam, wherein said portion of said scanned light beam received by said linear scale comprises said reference beam.

4. The raster data drawing apparatus according to claim 1, said delayed clock generator comprising:

a delay circuit that outputs a plurality of selectable delayed clock signals, a first selectable delayed clock signal formed by delaying said reference clock pulse signal by a second predetermined period and forming subsequent selectable delayed clock signals by delaying a previous selectable delayed clock signal by said second predetermined period, said second predetermined period being shorter than said predetermined period; and a selector that selects one of said plurality of selectable delayed clock signals.

5. The raster data drawing apparatus according to claim 4, said selector comprising:

a position detection device that detects a displacement of said image drawing plane from a reference position; and a controller that selects one of said plurality of selectable delayed clock signals based on said detected displacement by said position detection device.

6. The raster data drawing apparatus according to claim 5, further comprising means for shifting, in units of pixels, said raster data provided by said providing means at least in said main scanning direction when an image is drawn, and wherein said raster data drawing apparatus corrects for a displacement of said image drawing plane from said reference position in said main scanning direction, detected by said position detection device by said shift of said raster data in units of pixels executed by said shifting means and said selection of one of said plurality of selectable delayed clock signals.

7. A method for correcting for a displacement, in a main scanning direction, of an image drawing plane in relation to a reference position, in a scanning image forming system in which an image is formed on an image drawing plane, said method comprising:

detecting a displacement, in a main scanning direction, of the image drawing plane from the reference position;

generating a reference clock signal having a predetermined period;

generating a plurality of delayed clock signals having a predetermined period;

generating a plurality of delayed clock signals delayed from the reference clock signal by a plurality of periods, each period of the plurality of periods being less than the predetermined period of the reference clock signal;

selecting one of the plurality of delayed clock signals, based on the displacement; and forming the image based on the selected one of the delayed clock signals.

* * * * *